(12) United States Patent
Stevens et al.

(10) Patent No.: US 9,548,736 B2
(45) Date of Patent: Jan. 17, 2017

(54) RELATIVE TIMED CLOCK GATING CELL

(71) Applicant: UNIVERSITY OF UTAH RESEARCH FOUNDATION, Salt Lake City, UT (US)

(72) Inventors: Kenneth S. Stevens, Salt Lake City, UT (US); William Lee, Salt Lake City, UT (US)

(73) Assignee: The University of Utah Research Foundation, Salt Lake City, UT (US)

( * ) Notice: Subject to any disclaimer, the term of this patent is extended or adjusted under 35 U.S.C. 154(b) by 0 days.

(21) Appl. No.: 14/740,055

(22) Filed: Jun. 15, 2015

(65) Prior Publication Data

US 2016/0365857 A1     Dec. 15, 2016

(51) Int. Cl.
| | | |
|---|---|---|
| G11C 19/00 | (2006.01) | |
| H03K 19/00 | (2006.01) | |
| H03K 3/012 | (2006.01) | |
| H03K 21/40 | (2006.01) | |

(52) U.S. Cl.
CPC .......... *H03K 19/0016* (2013.01); *H03K 3/012* (2013.01); *H03K 21/40* (2013.01)

(58) Field of Classification Search
CPC ................................................ H03K 19/0006
See application file for complete search history.

(56) References Cited

U.S. PATENT DOCUMENTS

| | | | |
|---|---|---|---|
| 4,939,529 A * | 7/1990 | Kanayama | ........... G09G 3/3611 347/237 |
| 5,566,130 A | 10/1996 | Durham et al. | |
| 6,204,711 B1 | 3/2001 | Scarlett et al. | |
| 6,292,044 B1 | 9/2001 | Mo et al. | |
| 6,550,013 B1 | 4/2003 | Gervais et al. | |
| 6,557,161 B2 | 4/2003 | Jones | |
| 6,735,139 B2 | 5/2004 | Tang | |
| 6,989,695 B2 | 1/2006 | Dike et al. | |
| 7,657,862 B2 | 2/2010 | Kishnevsky et al. | |
| 7,786,758 B2 | 8/2010 | Kuhn | |
| 7,924,110 B2 | 4/2011 | McCorquodale et al. | |
| 8,051,396 B2 | 11/2011 | Beerel et al. | |
| 8,060,771 B2 | 11/2011 | Tyrrell | |
| 8,238,190 B2 | 8/2012 | Ja et al. | |

(Continued)

OTHER PUBLICATIONS

Wu, "Clock-Gating and Its Application to Low Power Design of Sequential Circuits," IEEE Transactions on Circuits and Systems I: Fundamental Theory and Applications, 2000, vol. 47, No. 103, pp. 415-420.

(Continued)

*Primary Examiner* — Daniel Puentes
(74) *Attorney, Agent, or Firm* — Michael Best & Friedrich LLP

(57) ABSTRACT

Technology is described for a relative timed clock gated cell. In one example, the relative timed clock gated cell includes a trigger latch and a data clock latch. The trigger latch includes a clock input coupled to a trigger line for transmitting a trigger signal. The trigger latch is configured to generate a data clock signal on an output. The trigger signal is based on a clock signal. The data clock latch includes a clock input coupled to the output of the trigger latch that latches a data input of the data clock latch based on the data clock signal. Various other computing circuitries and methods are also disclosed.

2 Claims, 8 Drawing Sheets

(56) References Cited

U.S. PATENT DOCUMENTS

| 8,453,079 B2 | 5/2013 | Manohar |
| 2013/0035099 A1 | 2/2013 | Boejer et al. |
| 2013/0043904 A1 | 2/2013 | Ivory |

OTHER PUBLICATIONS

Horak et al., "A Low-Overhead Asynchronous Interconnection Network for GALS Chip Multiprocessors," IEEE Transactions on Computer-Aided Design of Integrated Circuits and Systems, 2011, vol. 30, Issue 4, pp. 494-507.

Muttersbach et al., "Globally-asynchronous locally-synchronous architectures to simplify the design of on-chip systems," Twelfth Annual IEEE International ASIC/SOC Conference, 1999, pp. 317-321.

\* cited by examiner

RELATIVE TIMED CLOCK GATING CELL

STATEMENT REGARDING FEDERALLY SPONSORED RESEARCH OR DEVELOPMENT

This invention was made with government support under IIP1249016 awarded by the National Science Foundation. The government has certain rights in the invention.

FIELD OF THE INVENTION

The invention relates to low power digital electronics based on asynchronous signal protocols combined with clock protocols that employs a data signal as a clock in various parts of a design.

BACKGROUND

Clock gating is a technique used in many synchronous circuits for reducing dynamic power dissipation. Clock gating saves power by adding more logic to a circuit to prune a clock tree. Pruning the clock disables portions of the circuitry so that the flip-flops and logic in the circuitry do not switch states. Switching states consumes power. When digital circuitry is not being switched, the switching power consumption goes to approximately zero, where only small leakage currents are incurred.

Clock gating works by controlling the enable conditions attached to registers, and uses that control to gate the clocks. The clock gating may reduce the die area, as well as reduce power consumption. However, the clock gating logic can also change the clock tree structure, since the clock gating logic may be part of the clock tree.

SUMMARY

In one embodiment, the invention provides relative timed clock gating cell that includes a trigger latch and a data clock latch. The trigger latch includes a clock input coupled to a trigger line for transmitting a trigger signal, and the trigger signal is based on a clock signal. The trigger latch is configured to generate a data clock signal on an output. The data clock latch includes a clock input coupled to the output of the trigger latch that latches a data input of the data clock latch based on the data clock signal.

In one example, a data input of the trigger latch is coupled to at least one data line used to transmit a data signal. The trigger signal may be the clock signal, so the trigger latch can be referred to as a clock latch. In another example, the clock input of the trigger latch receives an asynchronous trigger signal that is logically ANDed with a first delayed clock signal. The relative timed clock gating cell can also include an AND function to combine the data clock signal with a second delayed clock signal used as the clock input to the data clock latch. The second delayed clock signal can be delayed after the first delayed clock signal. The relative timed clock gating cell can also include a synchronization cell to synchronize the asynchronous trigger signal to the clock signal.

In another configuration, the relative timed clock gating cell includes a function cell with combinational logic or sequential logic. A data input for the data clock latch is coupled to an output of the function cell, and inputs of the function cell include at least two inputs including an output from another latch, a data signal, the clock signal, and/or the data clock signal. The relative timed clock gating cell can include a delay element in a path between the output of the trigger latch and the clock input of the data clock latch for minimum delay buffering of the data clock signal that provides a setup time of the data input of the data clock latch. Alternatively or in addition, the relative timed clock gating cell can include a delay element included in the function cell for minimum delay buffering of the output of the trigger latch that provides a hold time of the data input of the data clock latch. The data input for the data clock latch is a monotonic signal.

The relative timed clock gating cell can provide a clock function for a device, such as a universal asynchronous receiver/transmitter (UART), an inter-integrated circuit ($I^2C$), an integrated interchip sound ($I^2S$), or serial peripheral interface (SPI).

In another example, a cascading relative timed clock gating circuit can include a plurality of relative timed clock gating cells. The cascading relative timed clock gating circuit includes a first relative timed clock gating cell and a second relative timed clock gating cell. The first relative timed clock gating cell includes a first trigger latch and a first data clock latch. The first trigger latch includes a clock input coupled to a trigger line that is used to transmit a trigger signal. The first trigger latch is configured to generate a first data clock signal on an output of the first trigger latch, and the trigger signal is based on a clock signal. The first data clock latch includes a clock input coupled to the output of the first trigger latch that latches a first data input of the first data clock latch based on the first data clock signal. The second relative timed clock gating cell includes the first data clock latch and a second data clock latch. The first data clock latch is configured to generate a second data clock signal on an output of the first data clock latch. The second data clock latch includes a clock input coupled to the output of the first data clock latch that latches a second data input of the second data clock latch based on the second data clock signal.

A counter circuit can be designed to include the relative timed clock gating cell. The counter circuit includes at least one two-bit shift register and a counter cell. The at least one two-bit shift register is configured as a ring counter including a first latch and a logic component. The logic component is a second latch or an inverter. A clock input for the first latch and is coupled to a trigger line for transmitting a trigger signal. An output of the first latch and an output of the logic component have opposite values. The output of the logic component provides an input to the first latch and is configured to generate a data clock signal. The trigger signal is based on a clock signal. The counter cell is coupled to the output of the logic component of a last stage two-bit shift register. The counter cell increments on an edge of the data clock signal. The counter cell is a smaller bit counter than bits counted by the counter circuit. In another example, the counter circuit includes a second two-bit shift register. The second two-bit shift register includes a third latch and a second logic component. The second logic component is a fourth latch or a second inverter. A clock input for the third latch is coupled to a second trigger line for transmitting a second trigger signal. An output of the third latch and an output of the second logic component have opposite values. The output of the second logic component provides an input to the third latch and is configured to generate the trigger signal for the first latch. In this way, the output of the second logic component of an earlier stage two-bit shift register provides the clock input to a later stage two-bit shift register (e.g., the first latch).

In another embodiment, the invention includes a relative timed clock gated circuit that includes circuitry configured to activate the circuitry based on a trigger clock signal and trigger an action based on the trigger clock signal. The trigger clock signal is generated from a logical ANDing function of an asynchronous trigger signal with a clock signal. The asynchronous trigger signal has a fewer number of cycles than the clock signal. The clock signal can include a delayed clock signal that is phase shifted from the clock signal.

The relative timed clock gated circuit can include a relative timed clock gated state machine. The action includes a transitioning to a next state or incrementing counter to count cycles of the trigger clock signal. The circuitry can be configured to reset the state machine to a default state based on a second input, or count multi-cycle clock events within a state after the asynchronous trigger signal is asserted.

In another embodiment, the invention provides a method of generating a relative timed clock gating circuit clocked by a trigger signal. The method includes the step of generating a trigger signal based on a clock signal. The trigger signal has a fewer number of cycles than the clock signal. The step of latching a data input of a trigger latch based on the trigger signal applied to the clock input of the trigger latch follows. The next step of the method is updating a function in a register based on the trigger signal.

The trigger signal is derived from an asynchronous data signal combined with the clock signal. The function includes combinational logic or sequential logic that includes at least one data signal input and an input including an output from another latch, at least one data signal, the clock signal, or the data clock signal generated from the trigger latch.

In an example, another step of the method can be delaying an output of the trigger latch provided to the clock input of the register for minimum delay buffering that provides a setup time for an input to the register, and/or delaying an output of the trigger latch provided to the clock input of the register for minimum delay buffering that provides a setup time for an input to the register.

The register can be included in a register bank, a subsystem, or a state machine. The method can be implemented in an electronic design automation (EDA) tool. The method can be implemented in Verilog code. The Verilog code can be represented in the form of:
always @ (edge trigger) begin
  result<=function;
end.

The "always @ (edge trigger)" of the Verilog code represents a module that is active on a positive edge or a negative edge of the trigger signal. The function updates a result in the register on the positive edge or the negative edge of the trigger signal.

Other aspects of the invention will become apparent by consideration of the detailed description and accompanying drawings.

DETAILED DESCRIPTION

Figure 1:
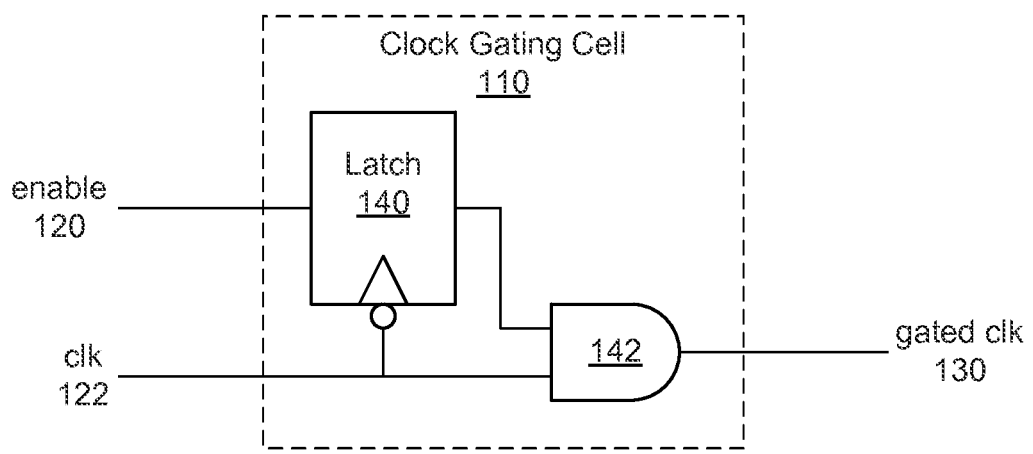
FIG. 1 illustrates a schematic diagram of a clock gating cell.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Numbers provided in flow charts and processes are provided for clarity in illustrating steps and operations and do not necessarily indicate a particular order or sequence. Reference is made to digital signals (e.g., a logic one (or "one") or a logic high voltage; or a logic zero (or "zero") or a logic low voltage) that represent corresponding voltages for a specified time duration as recognized by one skilled in the relevant art. For example, the logic high voltage represents a nominal 1.5 volts (V), 1.8V, 2.5V, and 3.3V; and the logic low voltage represents a nominal 0V or ground.

This description provides an overview of various circuits, components, and configurations that can be used to provide relative timed clock gating. The circuits can use an asynchronous data message on a data channel along with a clock signal generated by a local or system clock. The terms "circuit," "cell," "block," "module," and "submodule" may be used interchangeability for a circuit with one or more components that provides a specified function, unless otherwise stated. A system may include one or more blocks. The term "channel" refers to a physical transmission medium between components, circuits, or systems, such as a conductive line, wire, a pin, a signal trace, or other coupling between electrical components, circuits, or systems. In wireless applications, a channel includes a radio channel. The phrases "data channel" and "communication link" may be used interchangeability for a means by which data is transmitted. A data message or communication message is transmitted on the data channel. In a wired or optical configuration, the data channel is a data line or data bus. In a wireless configuration, the data message is transmitted on the data channel using a wireless protocol then transmitted on the data line or data bus within a wireless device.

Power usage in electronics is an important metric in electronic designs. Conventional digital electronic systems employ a clock that stores data into register banks. The clock is used to create data sequencing and to parallelize a design by using pipelining A pipeline is a set of data processing elements connected in series, where the output of one element is the input of the next one. The elements of a pipeline are often executed in parallel or in time-sliced sequence, in which case, buffer storage elements, such as registers, are often inserted between elements or stages. New data values are updated and stored in registers on a clock edge. The updated register values can be used as inputs to other combinational functions or logic. The registers keep the data stable until the clock edge which updates the values in the registers, allowing functions on the data values to stabilize at the inputs of the registers. Registers can provide storage components for a digital processor, such as a central processing unit (CPU), and other digital circuitry. A register bank can be formed from plurality of storage components, such as latches or flip-flops.

No explicit information is provided in the clocked design methodology indicating whether new data has arrived at a register that requests the new data to be stored. Clocking occurs periodically at a regular interval irrespective of the need to store a new value in the registers. By default, data is stored every clock cycle into every register. Clocking can result in significant inefficiencies in many systems as the registers are updated even though the input values have not changed or will not be used.

One approach to reduce energy is to create "clock gating logic" that will disable the propagation of the clock to a set of registers based on the current logic state of the circuit. Additional logic (with area and power overheads) are added to the system to calculate if a new value must be stored in the registers. Clock gating can provide an overall power reduction to the design if the reduction in energy from blocking the propagation of the clock is less than the energy of calculating the block condition and inserting new gates to block the propagation of the clock. Clock gating is widely used to reduce energy in a system.

FIG. 1 illustrates an example of a clock gating cell 110 used for clock gating. A clock gating cell interface includes an enable input 120 and a clock (clk) input 122 and a gated clock output 130. The clock gating cell 110 includes a latch 140 (e.g., flip-flop) and an AND gate 142 as circuit components. The latch 140 is a circuit that has two stable states (e.g., zero or one) and can be used to store state information based on a clock signal. As used herein, a latch can include a flip-flop, a clocked storage element, or a sequential storage element that has two stable states. The enable input 120 is coupled to a latch data input, the latch clock input is coupled to the clock signal, and the latch data output is coupled to an AND gate input. Another AND gate input is coupled to the clock input 122 and an AND gate output is coupled to the gated clock output 130. In operation, the latch input of the latch 140 receives an enable signal (e.g., a logic zero) on the enable input 120 and stores (or latches) the signal on a next falling edge of a clock signal, representing an enabled state. As used herein, "clock" refers to a clock signal with a regular pattern of high and low states (e.g., a square wave with a 50% duty cycle with a fixed, constant frequency). Then, the latch 140 propagates the stored signal (e.g., the logic zero) on to a latch output, which becomes an input for the AND gate 142, along with the clock input 122. In the enabled state, the AND gate 142 generates a gated clock signal on the gated clock output 130 that follows the clock on the clock input 122.

Depending on the configuration of the latch and/or coupling to the latch, the latch output may have the same value (i.e., non-inverted value) as the input in the previous clock cycle, or the latch output may have the inverted value of the input from the previous clock cycle. The clock gating cell 110 is shown with the latch output following the latch input (i.e., non-inverted). Depending on the configuration of the latch, the latch may store and/or output a value on either rising edge or the falling edge of the clock.

When a disable signal (i.e., non-enable signal, for example, a logic one) occurs on the enable input 120 (i.e., the latch data input), a disabled state occurs in the latch 140 on the next falling edge of the clock. Then, the AND gate 142 turns off the gated clock and blocks the clock on the clock input 122 from passing to the gated gate output. Thus, the gated clock is controlled by the enable input 120.

In other examples, other components and configurations of the clock gating cell may be implemented to perform clock gating, depending on whether the enable signal is a logic one or a logic zero, as recognized by one skilled in the relevant art. As used in the examples, an asserted signal refers to a logic one, and de-asserted or un-asserted signal refers to a logic zero.

Clock gating can be applied to modern clocked digital circuit designs in order to reduce power consumption. For example, the clock gating cell 110 blocks propagation of the clock signal before the signal reaches memory banks, which have a high capacity load. Clock gating occurs when the particular portion of the data path is not currently in use. Often clock gating is produced through enable signals generated from the present circuit state. A clocked circuit is typically used to determine when to apply the enable signals.

In many clocked systems, a dependency exists between the clock, which enables the sampling and observing data, and the observation and evaluation of data signals, which dictate whether operations (using the clock) are needed and/or if clock gating may occur. Conventional clocking methodologies employ the clock to determine the status of the clock gating signals (e.g., enable and disable signals). The circular dependency between the clock and the data indicating a signal may or may not be gated in conventional clocking methodologies creates inefficiencies in the ability to clock gate a system. So in conventional clocking methodologies, the clock is employed to evaluate the gating signal, and is thus active on that subset of signals. Thus, conventional clock gating is applied to block of a system after a data sampling block, but may not be applied to the sampling data block and/or the entire system.

Many communication circuits (e.g., UART, I2C, I2S, SPI, and many other communication peripherals and protocols) have interdependency between the clock and the data signals that determine if there is valid data. A universal asynchronous receiver/transmitter (UART) is computer hardware that translates data between parallel and serial forms. Inter-integrated circuit ($I^2C$ or I2C) is a multi-master, multi-slave, single-ended, serial computer bus used for attaching low-speed peripherals to computer motherboards and embedded systems. Integrated interchip sound ($I^2S$, I2S, Inter-IC Sound, or IIS) is an electrical serial bus interface standard used for connecting digital audio devices together. $I^2S$ is used to communicate pulse-code modulation (PCM) audio data between integrated circuits in an electronic device. The $I^2S$ bus separates clock and serial data signals, resulting in a lower jitter than is typical of communications systems that recover the clock from the data stream. Serial peripheral interface (SPI) bus is a synchronous serial communications device used for short distance, single master communication.

Even when idle, these communication circuits and systems typically sample communication links to determine if valid data has arrived, which disable clock gating to subsequent functions blocks (i.e., turning on the clock) to process the data. Clock gating sampling cells prevent the blocks from registering the changes on the polled signals.

Thus, conventional communication circuits use some type of synchronous circuit to sample at least one data channel of the communication link. As a result, a conventional sampling circuit is a synchronous circuit (or clock circuit) that does not use and/or benefit from clock gating. A synchronous circuit is a digital circuit in which the parts or components are synchronized by a clock signal.

Asynchronous circuits and systems, on the other hand, are reactive to system changes. An asynchronous circuit, or self-timed circuit, is a sequential digital logic circuit which is not governed by a clock circuit or global clock signal. Instead asynchronous circuits often use signals that indicate completion of instructions and operations, specified by data transfer protocols.

Asynchronous circuits do not need to sample data at predetermined intervals to determine data validity. As soon as data changes, the asynchronous circuit reacts to the change and modifies the state of the circuit. Thus, such asynchronous designs can remain idle (similar to a fully gated system), but then immediately react when an event occurs which requires a response.

Due to the reactive property of asynchronous systems, asynchronous circuits can provide a solution to building a clock gating circuit triggered by an asynchronous signal. An asynchronous circuit design carries data validity tokens with each data item. Multiple convergent data paths will not interact until valid data is present on all paths. Convergent data paths are multiple data paths with independent timing from each other that eventually combine together to form a result. If data on one path is early or late, the stage where data interacts will stall until all data arrives. Clocked design, on the other hand, optimizes the logic to remove data validity information and signaling from the system. Instead, a clocked design relies on cycle counts to ensure that multiple convergent data paths interact properly. In a clocked system, proper convergence of data paths is achieved by ensuring that data from all paths will always arrive at the stage where the data interact in the same cycle. While clocked systems and designs have some efficiencies, clocked systems and designs have other inefficiencies. For example, the explicit data validity information and logic (used in an asynchronous protocol) is removed, at the expense of wasting energy by clocking registers when no new data is present or will be used.

A hybrid approach can be used that combines the advantages of the asynchronous signaling protocols with the clocked-based protocols, where the data provides information on whether a pipeline stage should process and store information in those registers, and the data provides a data signal to clock the data, while retaining a clock-based interface.

This hybrid approach provides an alternative to conventional clock gating, illustrated in FIG. 1. The hybrid approach is referred to as relative timed clock gating or data clock gating. Relative timed clock gating is based on the concept of joining asynchronous handshake protocols to clocked design methodology in order to create a much more power efficient system. Relative timed clock gating retains a system clock, but vastly reduces the use of the clock in the system, and employs data signals much like an asynchronous handshake protocol to enable storing data in registers when new data arrives.

In conventional clocked designs, timing and sequencing is referenced from a clock signal. Data signals are used to conditionally propagate a clock signal.

In asynchronous handshake designs, timing and sequence is referenced from handshake signals that indicate data validity and control sequencing. The handshake signal is a data signal that is generated at the current pipeline stage and has been designed to be employed as a handshake control signal. Rather than global control, the data handshake signal is locally generated and timed.

Figure 2:
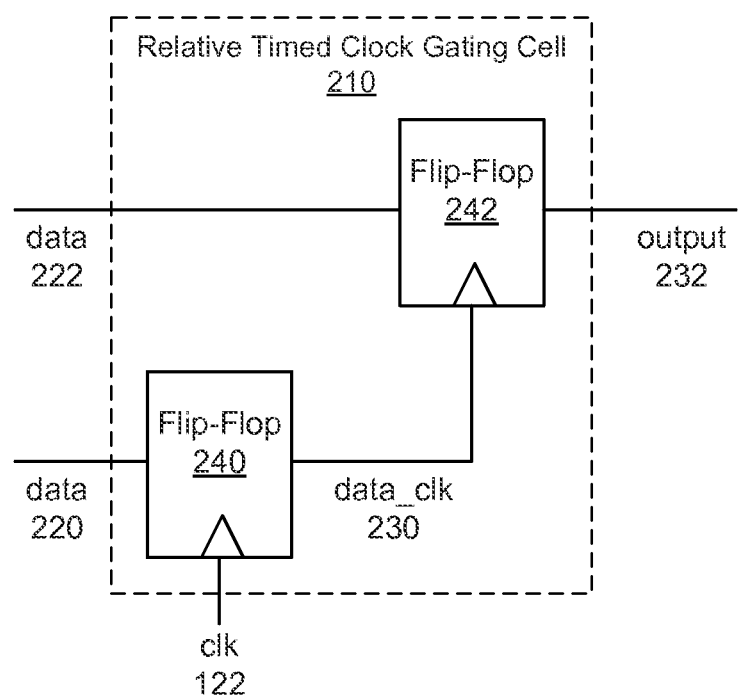
FIG. 2 illustrates a schematic diagram of a relative timed clock gating cell used to generate a data clock signal based on clock and data trigger signals.

FIG. 2 illustrates an example of a relative timed clock gating cell 210 used for relative timed clock gating. A relative timed clock gating cell interface includes an at least one data input 220 and 222, a clock (clk) input 122, and an output 232. The relative timed clock gating cell 210 includes two latches (e.g., flip-flops 240 and 242) as circuit components. The data input of the first latch 240 (also referred to as a trigger latch) is coupled to a data line (or data channel) 220 for detecting changes in the data signal indicating new data on the data line. The clock input of the first latch 240 is coupled to the clock (clk) that generates the clock signal. In operation, the output 230 (or data clock line or channel) of the first latch generates a data clock signal (data_clock or data_clk) that is only active based on a change of the data signal on the data line 220. The data clock line 230 is coupled to the clock input of the second latch 242 (also referred to as a data clock latch). The second latch 242 only switches based on the data clock signal. Thus, the second latch 242 does not expend power due to switching when the data signal is stable (i.e., idle). The data input of the second latch 242 is coupled to a data line (or data channel) 222 so the new data signal on the data line 222 can be stored in the second latch 242, which is outputted on the next cycle of the data clock signal. The data line 220 for the first latch 240 can be the same or different from the data line 222 for the second latch 242. Although FIG. 2 illustrates a single data clock latch 242 (or register), the clock inputs of multiple data clock latches 242 may be coupled to the data clock line 230 so the multiple data clock latches 242 forms a register bank clocked by the data clock signal instead of the clock signal.

Relative timed clock gating takes a data signal or set of data signals and uses these signals to directly clock blocks of logic ranging from registers (illustrated in FIG. 2) in register banks, large subsystems, and state machines. Relative timed clock gating has similarities to asynchronous handshake logic where data signals are used for both sequencing and timing.

Relative timed clock gating differs from a conventional asynchronous design because the sequencing and timing control signals are not true handshake signals. Typically, an asynchronous circuit provides an acknowledge signal indicating the data has arrived. In relative timed clock gating, the timing reference signal may not be acknowledged, and may be based on a clocked timing reference at some point (e.g., after clocking is initiated). Complete request acknowledge handshakes are often not employed in relative timed clock gating. Instead, single data "trigger" signals are often used to clock pipeline stages.

Relative timed clock gating also has advantages over conventional clock gating. For example, rather than use the data signal to gate or enable the clock to operate on a circuit block, relative timed clock gating uses the data trigger signal as a clock. The data trigger signals (derived from the data signals) are asserted when data is valid, and the data signals are stored in the register just like other data signals. The registers used to store the data signals may be clocked by other such data trigger signals. Relative timed clock gating can produce an effect of delaying and skewing the clocking relationship at different nodes. Clock skew (or timing skew) is a phenomenon in synchronous circuits in which a clock signal arrives at different components at different times.

Relative timed clock gating can be mechanically applied in various forms to a clocked system to reduce the energy consumption clocked system. The translation using relative timed clock gating can result in a design that is functionally equivalent to the original system that uses just the clock but with less power consumption.

Relative timed clock gating can be implemented using a hardware description language (HDL), such as Verilog. A HDL is a specialized computer language used to program the structure, design, and operation of electronic circuits, and most commonly, digital logic circuits. The HDL enables a precise, formal description of an electronic circuit that allows for the automated analysis, simulation, and simulated testing of an electronic circuit. The HDL also allows for the compilation of an HDL program into a lower level specification of physical electronic components, such as the set of masks used to create an integrated circuit. HDLs form an integral part of electronic design automation (EDA) systems and tools. Verilog, standardized as Institute of Electrical and Electronics Engineers (IEEE) 1364, is a hardware description language (HDL) used to model electronic systems. Verilog can be used in the design and verification of digital circuits at the register-transfer level (RTL) of abstraction. Although the invention is described using Verilog statements, other HDLs may also be used, such as Very High Speed Integrated Circuit (VHSIC) HDL (VHDL).

Verilog can be used to illustrate relative timed clock gating circuits over conventional clocked circuits. In a conventional clocked system, the Verilog statement always @ (posedge clk) can create a register bank that is clocked with the clk signal on the positive edge (posedge). In relative timed clock gating, rather than use the clock to store data in register banks, a data signal is used.

As previously shown, the structure in FIG. 2 can be used to form a relative timed clock gating cell 210. As shown, the output (i.e., data clock signal 230) of the clocked flip-flop 240 is directly employed as a clock to other register(s) (e.g., latch 242), instead of using the clock directly, so a clocked register bank (e.g., including latch 242) only conditionally updates the values of the registers. As a result, the clock gating energy used in the system is reduced significantly.

Figure 3:
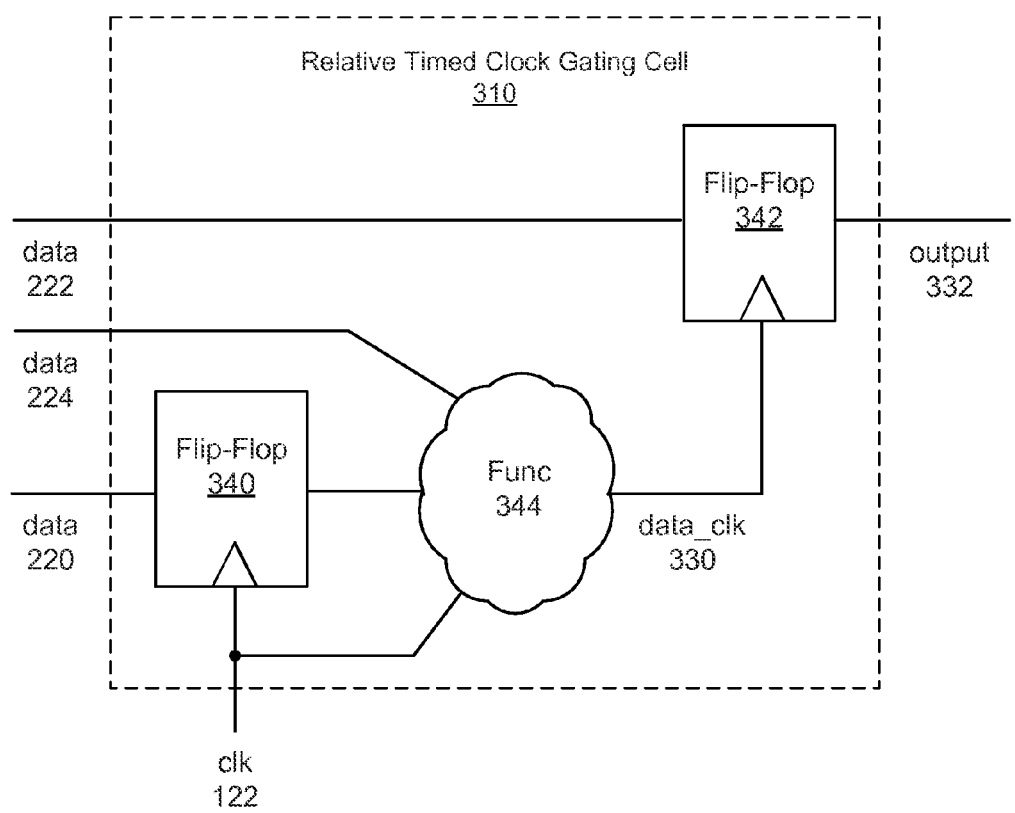
FIG. 3 illustrates a schematic diagram of a relative timed clock gating cell including a function block used to generate a data clock signal based on clock and data trigger signals.

FIG. 3 illustrates another example of a relative timed clock gating cell 310 used for relative timed clock gating. A relative timed clock gating cell interface includes an at least one data input 220, 222, and 224, a clock (clk) input 122, and an output 232. The data line 224 can be the same or different from the data line 220 or the data line 222. The relative timed clock gating cell 210 includes two latches (e.g., flip-flops 340 and 342) and a combinational or sequential block Func 344. Inputs to the combinational or sequential block Func 344 can come from at least two different sources: first, clocked data coming from a register (e.g., flip-flop 340), second, data 224 from other registers or other sources, and third, even employ the clock signal 122 as an input to the Func block 344. The delay through the Func block 344 results in a delayed clocking of the second flip-flop 342 in relation to the output of the first flip-flop 340.

One property of relative timed clock gating is that the data clock signal should be monotonic—the data clock signal does not glitch. A monotonic signal is a signal that rises or falls at most once per clock cycle. Because each rising transition into a flip-flop 342 can sample new data on the input 222, if the data clock signal can glitch, incorrect data may be sampled. In the example shown in FIG. 2, where data comes straight from a flip-flop 240, glitching does not occur as the data clock signal monotonically changes from low to high, changes from high to low, or remains in its current state (i.e., previous output of high or low). Other methods of registering the data clock signal and generating the data clock output 330 can be employed, so long as the output 330 from block Func 344, which generates data clock, is monotonic. Various methods (e.g., those used in EDA tools) can be used of proving whether glitches can occur in the combinational logic and/or if a signal output is monotonic.

In an expression of a conventional clocked design expressed in Verilog code, shown below (i.e., conventional clocked code segment), the register is clocked by the clk signal, which is in the always @ block. The data signal trigger is sampled every clock cycle. When trigger is true on the rising edge of the clock (posedge clk), the value of function will be stored in register result. The "//" represents comments in Verilog.

```
// Conventional clocked code segment
always @ (posedge clk) begin
   if (trigger) begin
      result<=function;
   end
end
```

The conventional clocked design, shown above (i.e., conventional clocked code segment), can be modified to implement relative timed clock gating, which can be expressed in the Verilog code as a relative timed clock gating code segment.

```
// Relative timed clock gating code segment
always @ (posedge trigger) begin
   result<=function;
end
```

Rather than sample the trigger signal every clock cycle, the relative timed clock gating code segment will store the value of function in the register result every time trigger signal rises, which can occur much less frequently than the clk signal. The relative timed clock gating code segment is a much more energy efficient implementation of a clocked code segment. To implement relative timed clock gating in a clocked design, the way the Verilog code is written is modified. In addition, the timing of the design changes. The power advantages can be proportional to the number of cycles that trigger is true compared to the total number of clock cycles. In many designs the power savings is significant.

A mechanical translation of a clocked design into a design using relative timed clock gating can result in a more energy efficient circuit. The translation due to relative timed clock gating, first, changes the timing of the design and, second, can change the behavior of a design. Although some timing changes, ideally the relative timed clock gating modifications do not adversely modify the behavior or performance of the design.

A Counter Example Illustrating Timing

Relative timed clock gating modifications to a counter circuit can be used to lower the power in a counter circuit. Timing changes can also be illustrated with the relative timed clock gating modifications to the counter circuit. A conventional 32-bit register counter circuit can be represented in Verilog code.

```
// Conventional clocked 32-bit counter circuit
always @ (posedge clk or reset) begin
   if (reset) cnt32<=32'h0;
   else cnt32<=cnt32+1;
end
```

The conventional counter circuit design employs time references that are calculated from the number of clock cycles that have elapsed. In such a design, the counter is continually clocked. On each rising edge (posedge) of the clk signal or a reset signal, all 32 registers of the counter are clocked or switched. This clocking operation on the switched and the un-switched registers expends lots more energy than necessary, since only two values on average change per clock cycle (regardless of the size of the counter).

Figure 4A:
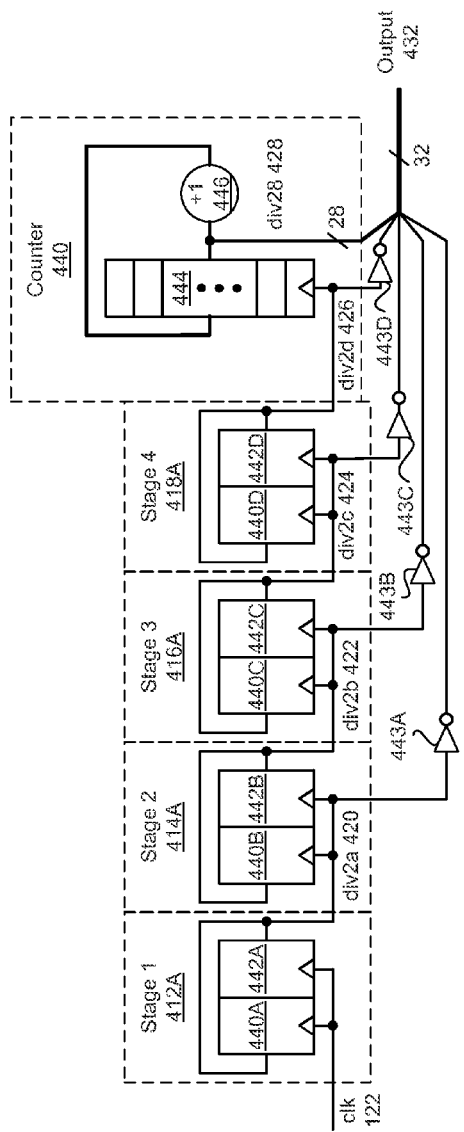
FIGS. 4A-4C illustrate schematic diagrams of a counter using relative timed clock gating.

FIG. 4A illustrates a counter using the relative timed clock gating cell structure shown in FIG. 2, where the output of a register 442A-D in one stage 412A, 414A, 416A, and 418A directly clocks another register 440B-D, 442B-D, and 442 in another stage 414A, 416A, 418A, and 440, respectively. A number of registers 442 in the final counter cell 440 are directly clocked with data signals (i.e., div2d 426) instead of the clock (clk) signal 122. The relative timed clock gating counter includes four 2-bit shift registers 440A-D and 442A-D and a 28-bit register 442 configured as a counter 440. Each of the four 2-bit shift registers 440A-D and 442A-D is configured as a ring counter and initialized with one of the registers (e.g., the first register 440A-D) reset to logic high and one of the registers (e.g., the second register 442A-D) reset to logic low. The first stage 412A registers 440A and 442A are clocked with the clk signal 122, the rest of the stages 414A, 416A, 418A, and 440 are clocked with the output (i.e., div2a 420, div2b 422, div2c 424, and div2d 426) from the previous 2-bit registers. Finally, a 28-bit register 444 is used for a counter and is clocked by the output (i.e., div2d 426) of the final 2-bit ring counter 418. The output 432 concatenates one-bit output (i.e., div2a 420, div2b 422, div2c 424, and div2d 426) from each of the four 2-bit ring counters 412A, 414A, 416A, and 418A with the output (i.e., div28 428) from the 28-bit counter 440 to form the 32-bit result.

Figure 4B:
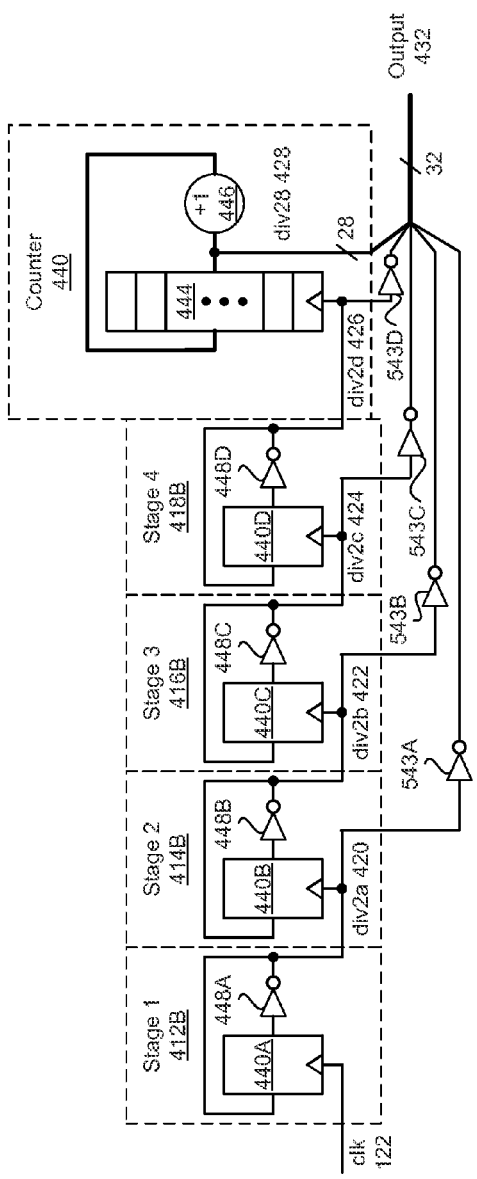

FIG. 4B illustrates another example of a counter using relative timed clock gating to implement the functions shown in FIG. 4A. The second register 442A-D in FIG. 4A of at least one of the stages 412B, 414B, 416B, or 418B can be interchangeable with an inverter 448A-D (in FIG. 4B). The second register 442A-D (in FIG. 4A) and inverter 448A-D (in FIG. 4B) are logic components that have an output that is opposite to the value of the output of the first register 440A-D. Each of the stages 412B, 414B, 416B, and 418B provides divide by 2 counter functions.

In FIGS. 4A-4B, the data value (i.e., div2a 420, div2b 422, div2c 424, and div2d 426) for each stage 412A-B, 414A-B, 416A-B, and 418A-B is taken from the output of the second register 442A-D (FIG. 4A) or the inverter 448A-D (FIG. 4B) and is used as part of the output 432. The data values from the second register 442A-D (FIG. 4A) or the inverter 448A-D (FIG. 4B) are inverted from the original data values. To have non-inverted data values, the data values (i.e., div2a 420, div2b 422, div2c 424, and div2d 426) are inverted by another set of inverters 443A-D.

Figure 4C:
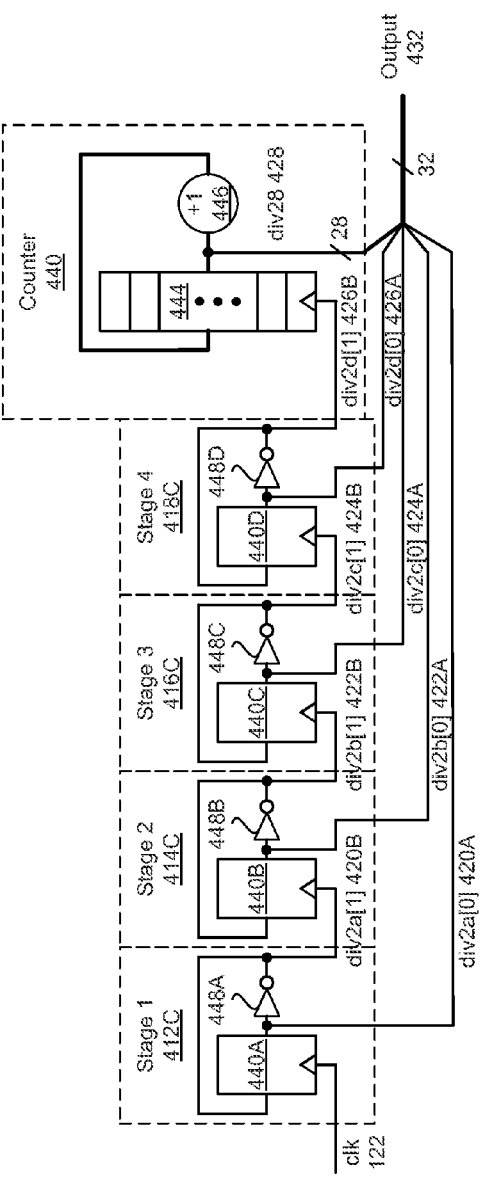

FIG. 4C illustrates another example of a counter using relative timed clock gating to implement the functions shown in FIGS. 4A-4B without the other set of inverters 443A-D (FIGS. 4A-4B). In FIG. 4C, the data value (i.e., div2a[0] 420A, div2b[0] 422A, div2c[0] 424A, and div2d[0] 426A) for each stage 412A-B, 414A-B, 416A-B, and 418A-B is taken from the output of the first register 440A-D (FIGS. 4A-4B) so data is non-inverted. The output (i.e., div2a[1] 420B, div2b[1] 422B, div2c[1] 424B, and div2d[1] 426B) of the inverter 448A-D in one stage 412C, 414C, 416C, and 418C directly clocks register 440B-D and 442 in another stage 414C, 416C, 418C, and 440, respectively. The counter in FIG. 4C uses fewer inverters and less energy usage than FIGS. 4A-4B. FIG. 4C can also be modified to include two registers (440A-D and 442A-D similar to FIG. 4A), instead of an inverter 448A-D, with the data value taken from the output of the first register 440A-D so data is non-inverted. Other examples (not shown) may also be used to perform the functionality shown in FIGS. 4A, 4B, and 4C.

The relative timed clock gating counter structure of FIGS. 4A-4C can also be represented in Verilog code, as follows.

```
// Relative timed clock gating counter
// Initialize variables
reg [1:0] div2a, div2b, div2c, div2d;
reg [27:0] div28;
wire result32={div28, div2d[0], div2c[0], div2b[0], div2a[0] };
// First stage 2-bit ring counter 412
always @ (posedge clk or reset) begin
if (reset) div2a<=2'b01;
else begin
   div2a[0]<=div2a[1];
   div2a[1]<=div2a[0];
end
end
// Second stage 2-bit ring counter 414
always @ (negedge div2a[1] or reset) begin
if (reset) div2b<=2'b01;
else begin
   div2b[0]<=div2b[1];
   div2b[1]<=div2b[0];
end
end
// Third stage 2-bit ring counter 416
always @ (negedge div2b[1] or reset) begin
if (reset) div2c<=2'b01;
else begin
   div2c[0]<=div2c[1];
   div2c[1]<=div2c[0];
end
end
// Fourth stage 2-bit ring counter 418
always @ (negedge div2c[1] or reset) begin
if (reset) div2d<=2'b01;
else begin
   div2d[0]<=div2d[1];
   div2d[1]<=div2d[0];
end
end
// 28-bit counter 440
always @ (negedge div2d[1] or reset) begin
if (reset) div28<=28'h0;
else div28<=div28+1;
end
```

In the example, the first stage 2-bit ring counter 412 is clocked on the rising edge (posedge) of the clock, and the second, third, and fourth stage 2-bit ring counter 414, 416, and 418 along with the 28-bit counter 440 are clocked on the falling edge (negedge) of the prior output. The counter illustrated in FIG. 4A uses four additional registers (i.e., 36 registers versus 32 for the conventional clocked counter), but can substantially reduce the energy usage by the counter. For example, the clocking energy of the counter is reduced by a factor of 5.5 (excluding the additional inverters 443A-D). Conventional counter consumes energy on each of the 32 registers in the counter for every clock cycle (i.e., 32 registers*1 energy unit=32 energy units, where an energy unit is a measure of the switching energy for a register on a clock cycle). In contrast, relative timed clock gating counter consumes energy on the first two registers for every clock cycle and less frequently for the subsequent registers clocked by the data clock (2 registers*1 energy unit for the first stage+2 registers*½ energy units for the second stage+2 registers*¼ energy units for the third stage+2 registers*⅛ energy units for the fourth stage+28 registers*1/16 energy units for the 28-bit counter=5.5 energy units, where an energy unit is a measure of the switching energy on a clock cycle). The counter illustrated in FIG. 4B still uses the same number of registers (e.g., 32 registers) as a conventional clocked counter. The four extra inverters 448A-D may still consume energy when the inverters switch values, so the energy consumed by FIG. 4C may still be approximately 5.5 energy units.

An additional energy benefit of using the relative timed clock gating counter is that the complexity of the incrementer 446 performing the increment (+1) function can be simplified. Rather than providing a 32-bit increment function, a 28-bit increment function can be used, which has less complexity. The lower order four bits are automatically calculated based on the direct clocking employed. In addition, logic that employs relative timed clock gating counter or incrementer is clocked once every sixteen cycles, rather than every cycle as in the conventional counter design (i.e., conventional clocked 32-bit counter circuit).

The timing that results from relative timed clock gating is different than timing that is used in a conventional clocked system. So additional methods beyond a typical clocked timing validation flow are used to ensure that timing fidelity exists in systems that use relative timed clock gating.

Figure 5:
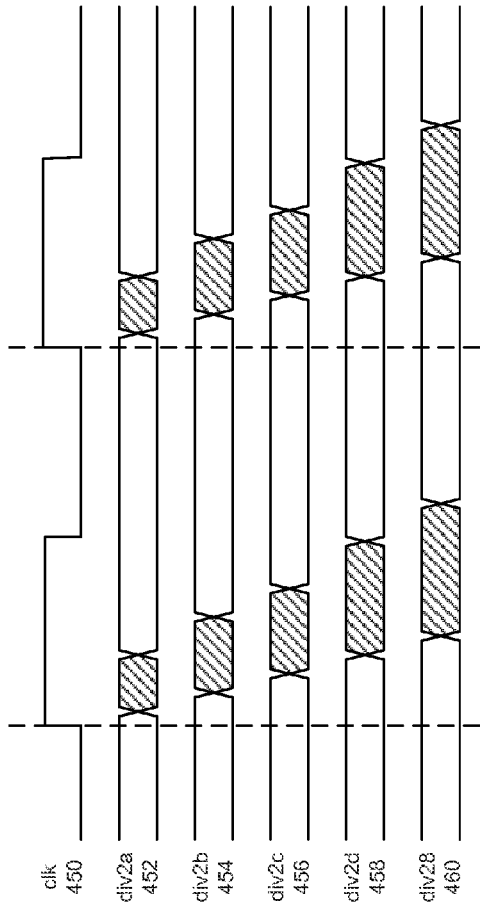
FIG. 5 illustrates a timing diagram for the counter of FIGS. 4A-4C.

FIG. 5 illustrates timing diagram for the relative timed clock gating counter shown in FIGS. 4A-4C and described above. The additional delay that accrues can be a drawback to relative timed clock gating that needs be recognized and directly validated in a design. The additional delay results in a timing artifact. For example, the first register set 412A-C is clocked with the clock (clk) 450, and the first register set 412A-C generates an output div2a 452. The second register set 414A-C is clocked with the output 452 of the first register set 412A-C, and the second register set 414A-C generates an output div2b 454. The third register set 416A-C is clocked with the output 454 of the second register set 414A-C, and the third register set 416A-C generates an output div2c 456. The fourth register set 418A-C is clocked with the output 456 of the third register set 416A-C, and the fourth register set 418A-C generates an output div2d 458. The 28-bit register bank 440 is clocked with the output 458 of the fourth register set 418A-C. The data coming out of the 28-bit register bank 440 is delayed by at least four clock-to-q delays, as illustrated in FIG. 5. The clock-to-q delay is the propagation delay within a register or flip-flop from a clock input to an output q. The hatched area on signals 452, 454, 456, 458, and 460 represents the timing range a register output q can switch after being clock by an earlier stage signal. The accumulative clock-to-q delay can pose a challenge if the output of a register used in relative timed clock gating is already on a critical path in the design. However, in many cases, counters are usually not on a critical path and such improvements to the power savings can be made on circuits, such as counters.

In a conventional clock system, a full counter output are stable the same time as output div2a 452 is stable in the relative timed clock gating counter design. In the relative timed clock gating counter design, the output 432 is not stable until output div28 460 is stable, which is a substantial delay later than output div2a 452. If the div28 value is stored directly by a register bank driven by a clock, then sufficient setup and hold time for the delayed div28 data values should be added to the system. If the delayed output is used in a combinational function that has more than a phase of logic delay, the circuit can fail to meet timing. The phase of logic is a time between clock edges.

Another property of relative timed clock gating is that cascading data requests from other data requests generates a larger and larger timing skew from the clock results, as shown in FIG. 5. The relative delays from the clock to data can be modeled and verified in the system to ensure timing fidelity. The modeling and verification can be performed using EDA tools.

Additional Setup and Hold Time

Relative timed clock gating can have additional timing consideration. For example, the modeling and verification should ensure data setup and hold times in the system are valid. Setup time is the minimum amount of time a data signal at an input should be held steady before an event (e.g., a clock event or trigger event) so that the data are reliably sampled by the register or flip-flop at the event. Hold time is the minimum amount of time the data signal at the input should be held steady after the event so that the data are reliably sampled by the register or flip-flop at the event.

Figure 6:
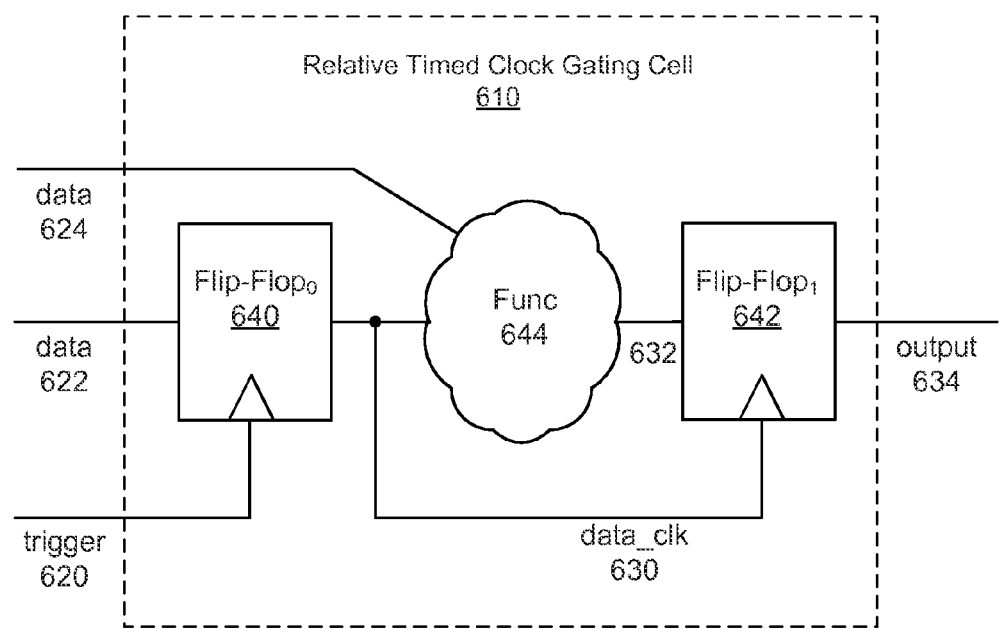
FIG. 6 illustrates a schematic diagram of a relative timed clock gating cell including a function block to process data and a data clock signal based on a data trigger signal for clocking data.

FIG. 6 illustrates another example of a relative timed clock gating cell 610 used for relative timed clock gating. The relative timed clock gating cell interface includes a trigger input 620, at least one data input 622 and 624, and an output 634. The data line 624 can be the same or different from the trigger line 620 or the data line 622. The relative timed clock gating cell 610 includes two latches (e.g., flip-flop$_0$ or $FF_0$ 640, and flip-flop$_1$ or $FF_1$ 642) and a combinational or sequential block Func 644. The block Func 644 is coupled to the output of the FF0 640 and the input of the FF1 642. Inputs to the combinational or sequential block Func 644 can come from at least two different sources: first, triggered data coming from a register (e.g., FF0 640), and second, data 624 from other registers or other sources as an input to the Func block 644.

The data input (e.g., 632) and the clock input (e.g., data_clk 630) into a flip-flop (e.g., $FF_1$ 640) can be sourced from the same signal (e.g., trigger 620). The design should ensure that data into the flip-flop (e.g., $FF_1$ 640) has sufficient time to meet the setup and hold requirements of the flip-flop. Setup and hold requirements can be accomplished by adding padding in one of two locations: the data_clk signal 630 path or the signal path 632 between $FF_0$ 640 and $FF_1$ 640.

If data 632 is to arrive at $FF_1$ 642 before the clock input (data_clk 630), then minimum delay buffering is added to the data_clk signal 630 path. The data_clk signal 630 path delay should be sufficient in the worst case corners to allow the data input 632 to the flip-flop (e.g., $FF_1$ 640) to arrive a setup time before the data_clk signal 630. Corners are used in static timing analysis (STA) to determine setup time violations and hold time violations. A setup time violation occurs when a signal arrives too late, and misses the time when the signal should advance. A hold time violation occurs when an input signal changes too soon after the clock's active transition. Static timing analysis is a method of computing the expected timing of a digital circuit without requiring simulation. Worst case corners assume the latches and components are either fast or slow to determine a worst case expected timing.

If data is to arrive at $FF_1$ after the clock input (data_clk 630), then minimum delay buffering is added to the $FF_0$ to $FF_1$ data path through block Func 644. The $FF_0$ to $FF_1$ data path delay should ensure in the worst case corner that sufficient hold time occurs on the data input 632 to $FF_1$ 642 before the data_clk signal 630 can change. The size of the delays can be calculated with EDA tools that evaluate circuit timing.

While relative timed clock gating has similarities to designs with a large clock skew, the source of the clock skew between registers has a different the mechanism causing the skew and the magnitude of the skew. Additional design constraints and validation tools may be used to ensure sufficient setup times and hold times occur. If data can change the same clock cycle as data_clock, additional minimum delay buffers can be added. Delay buffers can increase the area and energy usage. As result, relative timed clock gating may not be beneficial in reducing the area of the circuit. Thus, based on design objectives, relative timed clock gating may not be beneficial in all designs that it can be implemented.

Behavioral Equivalence

Relative timed clock gating can change the behavior of a design. For example, in the conventional clocked code segment, the function is stored in result every cycle that the trigger is asserted. However, in the relative timed clock gating code segment, the function is stored into the result only on the rising edge of the trigger signal (without behavioral modifications of the design). If trigger is asserted for two adjacent clock cycles, then in the conventional clocked code segment, the result is updated twice, but in the relative timed clock gating code segment, result is updated once. Thus, if trigger is asserted for multiple clock cycles, the conventional clocked design may not be behaviorally equivalent to a relative timed clock gating design.

If the trigger signal is behaviorally guaranteed to be asserted for a single clock cycle, then the translation represented by the relative timed clock gating code segment is correct and complete and can be substituted for the conventional clocked code segment. However, if the trigger signal can be asserted for multiple clock cycles, directly using just the trigger signal is not sufficient. A function of the trigger signal is employed to create a new assertion of the trigger signal each cycle. For example, the combination of the trigger signal with the clock signal can be used, as previously shown in FIG. 3.

The trigger function should toggle for each clock cycle if and when the trigger signal is asserted in adjacent clock cycles. In this respect, relative timed clock gating has similarities to asynchronous designs. In asynchronous design, a handshake is employed that ensures that the trigger signal is asserted for each piece of data that is received. In a clocked system, the clock serves as the acknowledgement signal in the handshake, by indicating that the operation has completed. Thus, the trigger function in relative timed clock gating raises and lowers a multi-clock cycle trigger signal once each clock cycle that trigger is asserted. In one example, the multi-clock cycle trigger signal can be generated by using a logic AND function to combine the trigger signal with the clock signal, which ensures that the trigger signal asserts once per clock cycle.

Figure 7:
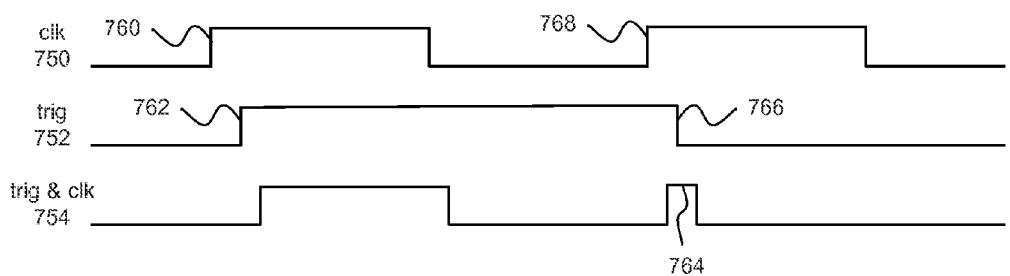
FIG. 7 illustrates a timing diagram showing clock and data trigger signals.

Delaying or shifting the clock signal in the multi-clock cycle trigger signal can ensure that the monotonicity requirement for relative timed clock gating is satisfied. A timing issue may arise with directly ANDing the clock signal (clk 750) and the trigger signal (trig 752) due to delays in gating and latching the signals, which can invalidate the monotonicity requirement, as shown in FIG. 7. Since the trigger signal 752 (e.g., data_clk 330 in FIG. 3) is generated from the clock signal 750 (e.g., 122 in FIG. 3), the trigger signal 752 normally becomes asserted 762 after the clock signal 750 is asserted. The multi-clock cycle trigger signal (trig & clk 754) results in a glitch 764 when the trigger signal 752 lowers 766.

The glitch 764 occurs due to the second rising edge 768 of the clock signal 750. Since trigger signal (trig 762) is generated from the clock, the trigger signal 752 will be delayed in relation to the clock. Directly ANDing the trigger signal 752 and the clock signal 750 can generate a second small pulse 764, which can result in a runt pulse 764 or incorrect operation by overwriting the register.

Figure 8:
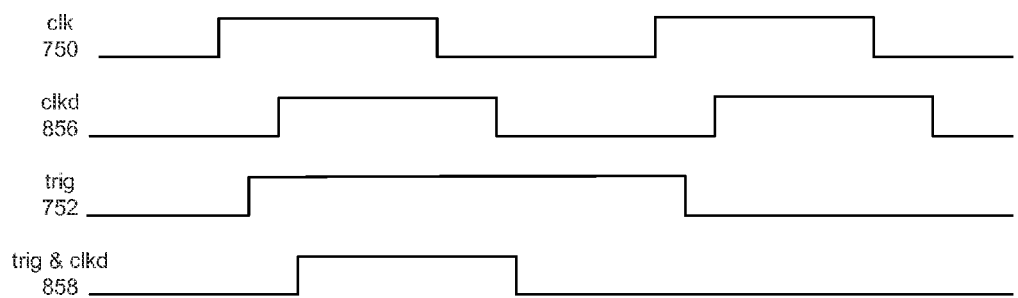
FIG. 8 illustrates a timing diagram showing clock, delayed clock, and data trigger signals.

The clock signal 750 can be delayed (e.g., clkd signal 856) sufficiently so that the delay clock signal 856 is guaranteed to occur after the trigger signal 752, as illustrated in FIG. 8. Directly ANDing the trigger signal 752 and the delayed clock signal 858 creates a glitch-free design for the multi-clock cycle trigger signal (trig & clkd 856). The multi-clock cycle trigger signal (trig & clkd 856; data_clk 330 in FIG. 3) using the delayed clock 856 (as part of block Func 644 in FIG. 3) resolves the challenge of having the trigger signal assert every clock cycle.

Cycle Accuracy

However, another challenge can occur from a behavioral perspective, which can be illustrated by referring back to FIG. 3. Because the trigger (data_clk 330) is a data signal launched from a clock 122, the data 222 is not actually observed in a system until the next edge of the clock. So using the trigger signal directly as a clock or ANDing the trigger signal with the delayed clock can result in data being latched a cycle later.

Another challenge of relative timed clock gating relates to the cycle in which events occur, which can be illustrated by referring back to FIG. 6. In a clocked system, trigger 620 and data_clk 630 are both derived from the clock signal. Data through Func 644 is stored in $FF_1$ 642 on the clock cycle after data is stored in $FF_0$ 640. However, the option exists to store data into $FF_1$ 642 in the same clock cycle as the data stored in $FF_0$ 640. Storing data in both in $FF_0$ 640 and $FF_1$ 642 in the same clock cycle can occur when data_clk signal 630 is delayed until after data from $FF_0$ 640 through block Func 644 is valid on the input to $FF_1$ 642. Delaying data_clk signal 630 results in the data latched in $FF_1$ 640 on the same effective clock edge (or same clock cycle) as data is latched in $FF_0$ 642. If data from $FF_1$ is used in a convergent data path with other clocked data words, failure to latch the same data in in $FF_1$ 640 and in $FF_0$ 642 in the same clock cycle can result in an erroneous result as the data from the path using relative timed clock gating (without the cycle modification) will be off by one cycle.

State Machine Example

Relative timed clock gating can also be implemented a state machine. A state machine or finite state machine (FSM) is a sequential logic circuit that can be in one of a finite number of states. The state machine is in only one state at a time; the state the circuit it is in at a given time is called the current state. The finite state machine can change from one state to another when initiated by a triggering event or condition called a transition. A particular finite state machine is defined by a list of its states, and the triggering condition for each transition. The state machine remains idle until a trigger event is detected. Then one or more transitions occur until the state machine reaches another quiescent state. Each transition or trigger event can change states.

The conventional clocked state machine can be represented in Verilog code, as follows.

```
// Conventional clocked state machine
// Initialize variables
reg [1:0] state, next_state;
reg [3:0] cnt, next_cnt;
// State table
parameter s0=2'b00,
``` s1=2'b01,
s2=2'b10,
s3=2'b11;
// Next state assignment and other registers

```
always @(posedge clk or posedge rst)
  begin
    if (rst == 1'b0) begin
      state   <= s0;
      cnt     <= 4'h0;
    end
    else begin
      state   <= next_state;
      cnt     <= next_cnt;
    end
  end
```

//STATE MACHINE
// next state assignment—combinatorial

```
always @(*)
  begin
    // default values
    next_state   = s0;
    next_cnt     = 4'h0;
    case (state)
    // on first trigger move to state s1
    s0 : begin
      if (trigger == 1'b1)      next_state = s1;
    end
    // on second trigger go to state 2
    s1 : begin
      if (trigger == 1'b1)      next_state = s2;
      else                      next_state = s1;
    end
    // stay here for count cycles
    s2 : begin
      if (cnt < count) begin
        next_state    = s2;
        next_cnt      = cnt + 1;
      end
      else next_state = s3;
    end
    // when trigger and in2 asserted, goto s0
    s3 : begin
      if (trigger == 1'b1 && in2 == 1'b1)   next_state = s0;
      else                                   next_state = s3;
    end
    endcase // case(state)
  end
```

The illustrated state machine has four states, and a count register cnt that counts the number of clock cycles that occur in state s2. On reset, the machine moves to state s0. When a trigger event occurs, the machine moves to state s1. When the trigger event is asserted again in s1, the machine moves to state s2 and remains in state s2 for count clock cycles, at which point the machine moves to state s3. When trigger and in2 (i.e., a second input) then become asserted, the machine moves back to state s0. On each clock edge, the state register and the count registers are updated.

The conventional clocked state machine can be converted into a relative timed clock gated state machine design by having the state register and cnt register become clocked with a datapath signal derived from trigger, instead of being clocked with the clk signal. Since the signal stores a new state or increments a cnt register multiple times in certain states, the delayed_clk signal is ANDed with trigger. An additional signal and register, gateme, is employed to indicate when multi-cycle clock events are valid to occur. The gateme signal is added to the next state logic, as shown below in the relative timed clock gating state machine Verilog code. The gateme signal is asserted when multiple clock events can occur, such as when the clock cycle cnt is being computed. The relative timed clock gating state machine converts the clocked state machine design into a low power state machine that significantly reduces power consumption.

// Relative timed clock gating state machine
// Initialize variables
reg [1:0] state, next_state;
reg [3:0] cnt, next_cnt;
reg gateme, next_gateme;
assign triggerclk=(trigger|!gateme) & delayed_clk;
// State table
parameter s0=2'b00,
s1=2'b01,
s2=2'b10,
s3=2'b11;
//next state assignment & other registers

```
always @(posedge triggerclk or posedge rst) begin
  if (rst == 1'b0) begin
    state     <= s0;
    cnt       <= 4'h0;
    gateme    <= 1'b1;
  end
  else begin
    state     <= next_state;
    cnt       <= next_cnt;
    gateme    <= next_gateme;
  end
end
```

//STATE MACHINE using elative timing clock gating
// next state assignment—combinatorial

```
always @(*)
  begin
    //default values
    next_state     = s0;
    next_cnt       = 4'h0;
    next_gateme    = 1'b1;
    case (state)
      s0 : begin
        next_state   = s1;
      end
      s1 : begin
        next_state   = s2;
        next_gateme  = 1'b0;
      end
      s2 : begin
        if (cnt < count) begin
          next_state   = s2;
          next_gateme  = 1'b0;
          next_cnt     = cnt + 1;
        end
        else next_state = s3;
      end
      s3 : begin
        if (in2 == 1'b0) next_state = s3;
      end
    endcase // case(state)
  end
```

As illustrated, relative timed clock gating or data clock gating can be used in counter circuits and state machines. Relative timed clock gating can also be used in other clocked circuits, which can result in significant power reductions. For example, when relative timed clock gating is employed on a mixed signal chip, the design can resulted in a 3.5 reduction in energy (e.g., joules) for the digital portion of the design.

The ability to use data signals directly to gate a system provided by relative timed clock gating allows the system to become reactive and also allows the system to respond the same cycle data is produced. In this way relative timed clock gating allows the reactive property of asynchronous designs to be used in clocked designs, which can improve performance.

As discussed, various modifications to timing and behavior are implemented for relative timed clock gating. For example, data used for data clock should be monotonic, which is the case when the data clock signal comes straight out of a register. If a combinational logic or sequential function is used to create the data clock, steps should be taken to ensure the data clock is monotonic. If the clock is ANDed with data clock in the function, the clock should be delayed such that the delayed clock is guaranteed to switch after data clock.

Timing for relative timed clock gating is different from conventional clocked design, as data is delayed and skewed each time relative timed clock gating is cascaded and not synchronized back to the clock. Thus, relative timed clock gating can result in extra setup and/or hold time requirements and performance considerations.

The data signal can be employed directly or processed by a function. If the data clock can be asserted multiple cycles, logic is used to combine the trigger signal with the clock (e.g., a delayed clock) in order to create multiple edges on the trigger signal that will store new data in a register.

If not considered and corrected, relative timed clock gating can also introduce cycle inaccuracies as events occur a cycle earlier than be latched. The cycle inaccuracies can be avoided, by deferring action on the data clock until a next edge or until after data is valid on the input to the second register, which can provide cycle accuracy to a design.

Relative timed clock gating operates in a clocked design. The data clock trigger signals are initially referenced from a clock using a register. The clock driven signals generated from the outputs of earlier registers are used to store data in subsequent registers, and the output signals from the subsequent register in turn can be used to store data in other registers in a cascading configuration. As a result, later derived trigger signals can have a significant delay in relation to the original clock. Consideration and care should be used in storing data into registers or latches from signals that have different skew in relation to the clock or even back into registers or latches that use the clock directly to store data so data is stored in the same clock cycle.

Figure 9:
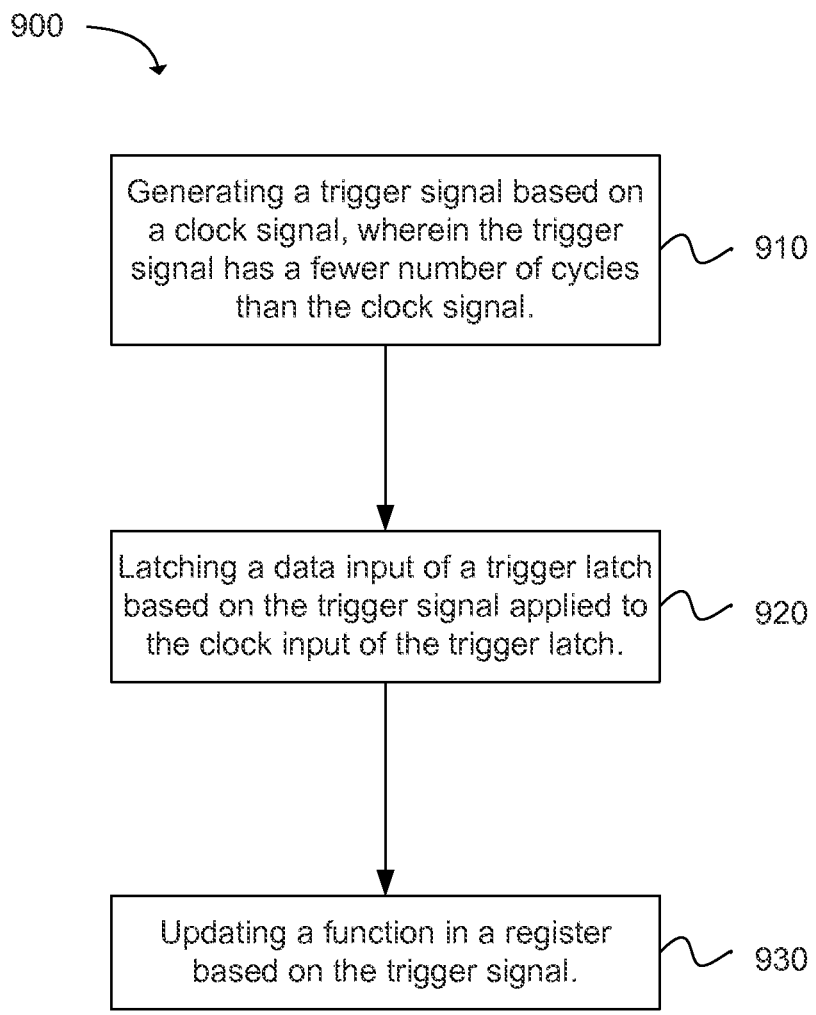
FIG. 9 is flowchart illustrating an example of a method of generating a relative timed clock gating circuit clocked by a trigger signal.

The flow chart shown in FIG. 9 illustrates a method 900 of generating a relative timed clock gating circuit clocked by a trigger signal. The method includes the step of generating a trigger signal based on a clock signal, wherein the trigger signal has a fewer number of cycles than the clock signal, as in step 910. The step of latching a data input of a trigger latch based on the trigger signal applied to the clock input of the trigger latch follows, as in step 920. The next step of the method is updating a function in a register based on the trigger signal, as in step 930.

Relative timed clock gating provides various advantages over conventional clock gating. Conventional clock gating is produced through enable signals generated from a present circuit state. The circuit state to generate clock gating is normally enabled when data is selectively steered to one of two data paths. The path that does not get the data has the clocks to that path shut off until data is launched down that path. Conventional clock gating uses multiplexers (MUXes) to determine where data is being steered, and clock gating the paths where data is not going. Relative timed clock gating uses the data signal to generate the trigger signals, and does not require multiplexers.

As shown, relative timed clock gating works well on state machines (e.g., relative timed clock gating state machine) that wait for trigger events and cycle through sequences of changes but then return to idle waiting for another trigger event. Relative timed clock gating is also demonstrated to work with local data dependencies such as an incrementer or counter (e.g., relative timed clock gating counter; FIGS. 4 and 5). Rather than clock all cells, the clock can be cascaded across the counter based on carry bits, which significantly reduces the clocking power.

Relative timed clock gating can work well with mixed signal design where samples are taken from analog circuits that are then processed within a digital clocked domain. Relative timed clock gating can work with clocked system where data dependencies create significant sections of logic that are idle.

Other approaches know to those in the art can be employed similar to the examples shown that described a simple function (e.g., relative timed clock gating code segment; FIGS. 2, 3, and 6), cascaded functions (e.g., relative timed clock gating counter; FIGS. 4 and 5), and state holding functions (e.g., relative timed clock gating state machine).

Relative timed clock gating can be applied in a digital design where a monotonic combinational logic signal can be generated that indicates a valid data sample has arrived. A monotonic (glitch free) data validity signal can be found in numerous clocked designs and applications, such as UART, I2C, I2S, SPI, and many other communication peripherals, protocols, and circuits.

Relative timed clock gating can be applied to wireless communications, such as third generation partnership project (3GPP) long term evolution (LTE), the Institute of Electrical and Electronics Engineers (IEEE) 802.16 standard (e.g., 802.16e, 802.16m), which is commonly known to industry groups as WiMAX (Worldwide interoperability for Microwave Access), and the IEEE 802.11 standard, which is commonly known to industry groups as WiFi, Bluetooth, and other protocols used by mobile phones and other hardware.

Circuitry can include hardware, firmware, program code, executable code, computer instructions, and/or software. A non-transitory computer readable storage medium can be a computer readable storage medium that does not include a signal.

It should be understood that many of the functional units described in this specification have been labeled as modules, in order to more particularly emphasize their implementation independence. For example, a module may be implemented as a hardware circuit comprising custom very-large-scale integration (VLSI) circuits or gate arrays, off-the-shelf semiconductors, including but not limited to logic chips, transistors, or other discrete components. A module may also be implemented in programmable hardware devices, including but not limited to field programmable gate arrays (FPGA), programmable array logic, programmable logic devices or similar devices.

Reference throughout this specification to an "example" or an "embodiment" means that a particular feature, structure, or characteristic described in connection with the example is included in at least one embodiment of the invention. Thus, appearances of the words an "example" or an "embodiment" in various places throughout this specification are not necessarily all referring to the same embodiment.

Furthermore, the described features, structures, or characteristics may be combined in a suitable manner in one or more embodiments. In the following description, numerous specific details are provided (e.g., examples of layouts and designs) to provide a thorough understanding of embodiments of the invention. One skilled in the relevant art will recognize, however, that the invention can be practiced without one or more of the specific details, or with other methods, components, layouts, etc. In other instances, well-known structures, components, or operations are not shown or described in detail to avoid obscuring aspects of the invention.

While the forgoing examples are illustrative of the principles of the invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited. Various features and advantages of the invention are set forth in the following claims.

What is claimed is:

1. A counter circuit comprising a relative timed clock gating cell, the counter circuit further comprising:
   at least one two-bit shift register configured as a ring counter including a first latch and a logic component, wherein the logic component is a second latch or an inverter, a clock input for the first latch and is coupled to a trigger line for transmitting a trigger signal, an output of the first latch and an output of the logic component have opposite values, the output of the logic component provides an input to the first latch and is configured to generate a data clock signal, and the trigger signal is based on a clock signal;
   a counter cell coupled to the output of the logic component of a last stage two-bit shift register, wherein the counter cell increments on an edge of the data clock signal, and the counter cell is a smaller bit counter than bits counted by the counter circuit.

2. The counter circuit of claim 1, further comprising:
   a second two-bit shift register including a third latch and a second logic component, wherein the second logic component is a fourth latch or a second inverter, a clock input for the third latch is coupled to a second trigger line for transmitting a second trigger signal, an output of the third latch and an output of the second logic component have opposite values, the output of the second logic component provides an input to the third latch and is configured to generate the trigger signal for the first latch.

* * * * *